United States Patent
Lee et al.

(10) Patent No.: US 11,114,616 B2
(45) Date of Patent: Sep. 7, 2021

(54) TI-BASED AMORPHOUS ALLOY AND PHASE CHANGE MEMORY DEVICE APPLYING THE SAME

(71) Applicant: Samsung Electronics Co., Ltd., Suwon-si (KR)

(72) Inventors: Eunsung Lee, Hwaseong-si (KR); Duseop Yoon, Seongnam-si (KR); Joungeun Yoo, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/550,476

(22) Filed: Aug. 26, 2019

(65) Prior Publication Data
US 2020/0274064 A1    Aug. 27, 2020

(30) Foreign Application Priority Data
Feb. 27, 2019    (KR) .......................... 10-2019-0023290

(51) Int. Cl.
*H01L 45/00*    (2006.01)
*H01L 27/24*    (2006.01)

(52) U.S. Cl.
CPC ............ *H01L 45/145* (2013.01); *H01L 27/24* (2013.01); *H01L 45/06* (2013.01); *H01L 45/1253* (2013.01); *H01L 45/148* (2013.01)

(58) Field of Classification Search
CPC ... H01L 45/145; H01L 45/06; H01L 45/1253; H01L 45/148; H01L 27/24
See application file for complete search history.

(56) References Cited

U.S. PATENT DOCUMENTS

| | | | |
|---|---|---|---|
| 7,893,419 B2 | 2/2011 | Hudgens et al. | |
| 8,379,440 B2 | 2/2013 | Altounian | |
| 2009/0057644 A1* | 3/2009 | Shin .................... | H01L 45/1625 257/4 |
| 2010/0277973 A1 | 11/2010 | Altounian | |
| 2011/0315942 A1* | 12/2011 | Tominaga ............. | H01L 45/065 257/1 |
| 2014/0192592 A1 | 7/2014 | Wu et al. | |

(Continued)

FOREIGN PATENT DOCUMENTS

| | | | |
|---|---|---|---|
| CN | 106711325 A | * | 5/2017 |
| CN | 107359238 A | * | 11/2017 |
| JP | 2005290404 A | | 10/2005 |

OTHER PUBLICATIONS

J. Orava et al., 'Characterization of supercooled liquid $Ge_2Sb_2Te_s$ and its crystallization by ultrafast-heating calorimetry' *Nature Materials*, vol. 11, No. 4, pp. 279-283 (2012).

*Primary Examiner* — Christine A Enad
(74) *Attorney, Agent, or Firm* — Harness, Dickey & Pierce, P.L.C.

(57) ABSTRACT

Provided are a titanium-based amorphous alloy and a phase-change memory device in which the titanium-based amorphous alloy is applied to a phase-change layer. The titanium-based amorphous alloy may include titanium, antimony, and at least one metallic component. The titanium-based amorphous alloy may be configured as a phase-change material having a reversible phase change between a titanium-based amorphous alloy phase and at least one crystalline phase.

14 Claims, 12 Drawing Sheets

(56) References Cited

U.S. PATENT DOCUMENTS

| | | | |
|---|---|---|---|
| 2016/0099050 A1* | 4/2016 | Wu | H01L 45/144 |
| | | | 365/163 |
| 2019/0044061 A1* | 2/2019 | Aella | H01L 45/1675 |
| 2019/0181336 A1* | 6/2019 | Lee | H01L 45/1233 |
| 2019/0189688 A1* | 6/2019 | Lille | H01L 45/1616 |

* cited by examiner

TI-BASED AMORPHOUS ALLOY AND PHASE CHANGE MEMORY DEVICE APPLYING THE SAME

CROSS-REFERENCE TO RELATED APPLICATION

This application claims the benefit of Korean Patent Application No. 10-2019-0023290, filed on Feb. 27, 2019, in the Korean Intellectual Property Office, the disclosure of which is incorporated herein in its entirety by reference.

BACKGROUND

1. Field

The present disclosure relates to titanium-based amorphous alloys and phase-change memory devices to which the titanium-based amorphous alloys are applied.

2. Description of Related Art

A phase-change memory device stores data by using a difference in resistances of an amorphous state and a crystalline state according to phase transition of a compound of a material of a phase-change material layer. For example, a reset current corresponding to a transition to an amorphous state having a relatively high resistance and a set current via which transition to a crystalline state having a relatively low resistance is made are transferred from a transistor or a diode formed on a substrate to a phase-change material layer by passing through a bottom electrode, thereby causing a phase change in the phase-change material layer. Information is stored by a phase change of a phase-change material having high resistance in an amorphous state and having low resistance in a crystalline state.

A representative phase-change material is a chalcogenide-based material (for example, $Ge_2Sb_2Te_5$(GST)). A phase-change memory using a chalcogenide-based material as a phase change material requires improvement such as reset energy reduction, etc.

In other words, although chalcogenide-based materials have been studied and used as phase-change materials for the last half-century, device performance such as reset energy (current density), cycle endurance, switching time, thermal stability, or the like have stagnated due to limited properties of GST phase-change materials. Thus, a material that overcomes these drawbacks is desired.

SUMMARY

Provided are titanium-based amorphous alloys that allow a reversible phase change between an amorphous state and a crystalline state and phase-change memory devices to which the titanium-based amorphous alloys are applied.

Additional aspects will be set forth in part in the description which follows and, in part, will be apparent from the description, or may be learned by practice of the presented embodiments.

According to an aspect of an embodiment, a titanium-based amorphous alloy includes titanium, antimony, and at least one metallic component. The titanium-based amorphous alloy may be configured as a phase-change material and may have a reversible phase change between a titanium-based amorphous alloy phase and at least one crystalline phase.

In some embodiments, the at least one metallic component includes Ni.

In some embodiments the titanium-based amorphous may further include at least one metalloid component.

In some embodiments, the titanium-based amorphous alloy may further include Cu, Zr, Sn, Be, Pd, Si, or a combination thereof.

In some embodiments, the titanium-based amorphous alloy may include a dopant.

In some embodiments, the dopant may include at least one of a metalloid, a non-metal, or a rare-earth element.

In some embodiments, the dopant may be selected from B, Si, Ge, As, and Te.

In some embodiments, the dopant may be selected from C, N, P, S, and Se.

In some embodiments, the dopant may be selected from Ce, Dy, Er, Eu, Gd, Ho, La, Lu, Nd, Pr, Pm, Sm, Sc, Tb, Tm, Yb, and Y.

In some embodiments, a Ti content of the titanium-based amorphous alloy may be 20% or higher.

In some embodiments, the titanium-based amorphous alloy may be Te-free.

According to an aspect of another embodiment, a phase-change memory device is provided. The phase-change memory device may include a first electrode; a second electrode spaced apart from the first electrode; and a phase-change layer between the first electrode and the second electrodes. The phase-change layer may include the titanium-based amorphous alloy described above.

In some embodiments, the first electrode may include a plug-type electrode, and the plug-type electrode may have a smaller width than the phase-change layer.

In some embodiments, the first electrode may include at least one conductive material from among various conductive materials such as titanium nitride (TiN), tantalum nitride (TaN), TiAlN, TaSiN, tungsten nitride (WN), tungsten nitride carbide (WNC), and doped Si.

In some embodiments, the second electrode may include at least one of various conductive materials such as Al, Au, Cu, Ir, Ru, Pt, Ti, TiN, Ta, and TaN.

In some embodiments, the pad-type electrode contacting the first electrode may be further included, and the pad-type electrode may include at least one of various conductive materials such as Al, Au, Cu, Ir, Ru, Pt, Ti, TiN, Ta, and TaN, and may have a single-layer or multi-layer structure.

According to example embodiments, a titanium-based amorphous alloy includes titanium (Ti), antimony (Sb), nickel (Ni), optionally at least one other element (D'). The titanium-based amorphous alloy being represented by Chemical Formula 1:

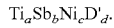   [Chemical Formula 1]

In Chemical Formula 1: a+b+c+d may equal 1; a may be greater than 0.2; b may be greater than 0 and less than 0.3; c may be greater than 0.05 and less 0.40; and d may be greater than or equal to 0. The titanium-based amorphous alloy may be capable of having a reversible phrase change, between a titanium-based amorphous alloy phase and at least one crystalline phase, in response to an applied energy to the titanium-based amorphous alloy.

In some embodiments, the titanium-based amorphous alloy may further include a dopant selected from B, Si, Ge, As, Te, C, N, P, S, Se, Ce, Dy, Er, Eu, Gd, Ho, La, Lu, Pr, Pm, Sm, Sc, Tb, Tm, Yb, and Y. The titanium-based amorphous alloy may be Te-free.

In some embodiments, the titanium-based alloy may include copper (Cu), both Cu and tin (Sn), or both Cu and silicon (Si). The titanium-based alloy optionally may include at least one other element (E'). The titanium-based amorphous alloy may be represented by Chemical Formula 1A:

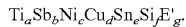   [Chemical Formula 1A]

In Chemical Formula 1A: a+b+c+d+e+f+g may equal 1; a may be in a range from 0.30 to 0.60; b may be greater than 0 and less than 0.30; c may be greater than 0.07 and less than 0.40; d may be greater than 0.20 and less than 0.40; and e, f, and g may each independently be greater than or equal to 0.

In some embodiments, in Chemical Formula 1A: a may be in a range from 0.35 to 0.57; b may greater than 0 and less than 0.23; c may be greater than 0.09 and less than 0.38; d may be in a range from 0.22 to 0.37; a+b+c+d may be greater than or equal to 0.9; e may be 0 if f is greater than 0; f may be 0 if e is greater than 0; g may be 0; and the titanium-based amorphous alloy may be Te-free.

According to an aspect of another embodiment, a phase-change memory device is provided. The phase-change memory device may include a first electrode; a second electrode spaced apart from the first electrode; and a phase-change layer between the first electrode and the second electrodes. The phase-change layer may include the titanium-based amorphous alloy described above.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
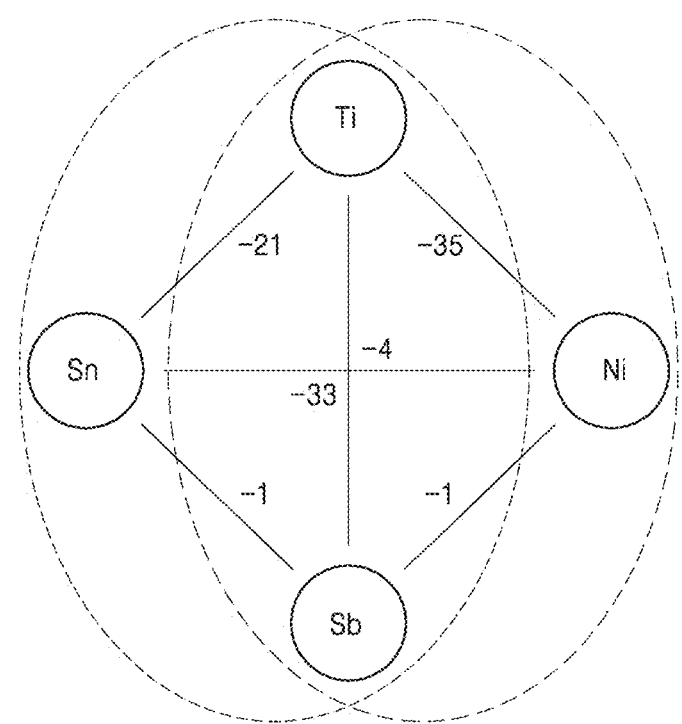
FIG. 1 shows examples of heat of mixing of Ti, Ni, Sn, Sb, and Ti at room temperature.

Reference will now be made in detail to embodiments, examples of which are illustrated in the accompanying drawings. In the drawings, like reference numerals refer to like elements throughout and sizes of constituent elements may be exaggerated for convenience of explanation and the clarity of the specification. In this regard, the present embodiments may have different forms and should not be construed as being limited to the descriptions set forth herein.

It will also be understood that when an element is referred to as being "on" or "above" another element, the element may be in direct contact with the other element or other intervening elements may be present. An expression used in the singular encompasses the expression of the plural, unless it has a clearly different meaning in the context. It should be understood that, when a part "comprises" or "includes" an element in the specification, unless otherwise defined, other elements are not excluded from the part and the part may further include other elements. The use of the terms "the" and similar referents in the context are to be construed to cover both the singular and the plural.

A titanium-based amorphous alloy according to an embodiment is based on titanium (Ti), and antimony (Sb) is added thereto, and the titanium-based amorphous alloy further includes at least one metallic component; as a reversible phase change between an amorphous state and at least one crystalline phase of the titanium-based amorphous alloy is possible, the titanium-based amorphous alloy may be used as a phase-change material. The titanium-based amorphous alloy according to the embodiment may have a Ti content of 20% or more, and may be formed tellurium (Te)-free. Also, the titanium-based amorphous alloy according to the embodiment may be doped with a dopant.

The titanium-based amorphous alloy according to the embodiment may include, for example, nickel (Ni) as a metallic component. That is, the titanium-based amorphous alloy may include, for example, $Ti_xNi_ySb_z$ (where x, y, and z>0).

Also, the titanium-based amorphous alloy according to the embodiment may further include at least one additional component in addition to titanium, antimony, and at least one metallic component, and the additional component may include a metallic component or a metalloid component. For example, the titanium-based amorphous alloy according to the embodiment may further include at least one of Cu, Zr, Sn, Be, Pd, and Si, as the additional component. Cu, Zr, Sn, Be, and Pd may correspond to a metallic component, and Si may correspond to a metalloid component. Here, the titanium-based amorphous alloy according to the embodiment may include, instead of Ni, at least one of Cu, Zr, Sn, Be, and Pd as a metallic component in addition to titanium and antimony.

A dopant used in doping a titanium-based amorphous alloy of a phase-change material according to the embodiment may include at least one of a metalloid, a non-metal, and a rare earth element. For example, the dopant may include a metalloid of at least one of B, Si, Ge, As, and Te. The dopant may include a non-metal of at least one of C, N, P, S, and Se. Also, the dopant may include at least one rare earth element from among cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

A crystallization rate of the titanium-based amorphous alloy according to the embodiment may be faster than a covalent bond due to a metallic bond, and thus, when the titanium-based amorphous alloy according to the embodiment is used as a phase-change material of a phase-change memory device, a required phase transition rate may be obtained.

Sb may be added to the titanium-based amorphous alloy according to the embodiment to increase a specific resistance of the titanium-based amorphous alloy while maintaining a phase transition phenomenon.

For example, to realize a titanium-based amorphous alloy according to the embodiment, a titanium-based metal glass which is a phase-change material as shown in Table 1 may be selected, and a basic composition of adding Sb to increase a specific resistance while maintaining a phase transition phenomenon may be selected.

TABLE 1

| No | Compositions (at. %) | Tg (° C.) | Tx (° C.) | Δ Tx (° C.) | Δ H (J/g) |
|---|---|---|---|---|---|
| TiNiCu | $Ti_{50}Cu_{35}Ni_{15}$ | 430 | 464 | 34 | 47.32 |
| TiNiSn | $Ti_{57}Ni_{37}Sn_6$ | 471 | 508 | 37 | 52.95 |
| TiNiSi | $Ti_{57}Ni_{35}Si_8$ | 487 | 532 | 45 | 106 |

Referring to Table 1, a composition to which Si is added showed good glass forming ability (GFA).

Examples of the basic properties of elements that may be used in the titanium-based amorphous alloy according to the embodiment are shown in Table 2. Table 2 shows examples of a covalent radius, a specific resistance (Rs), and a heat of mixing (ΔHm) with Sb of each of Ti, Ni, Sn, Si, and Sb. When conditions such as a multiple component alloy, a significant difference in atom sizes of the elements, negative heat of mixing, and proximity to a eutectic mixture are satisfied, a phase-change material may be formed.

TABLE 2

| Elements | Sb/Δ Hm (kJ/mole) | Covalent radius (Å) | Rs (μΩcm) @ 298K |
|---|---|---|---|
| Ti | −33 | 1.48 | 42.0 |
| Ni | −1 | 1.17 | 7.20 |
| Sn | −1 | 1.40 | 10.9 |
| Si | +9 | 1.14 | >1 × 10$^9$ |
| Sb | 0 | 1.40 | 40.0 |

Referring to Table 2, a Sb substitution rule with respect to a metal glass is shown. That is, heat of mixing with Sb needs to have a negative heat of mixing, and radius sizes need to be similar to each other such as (Sb↔Ti,Sn; Si↔Ni). According to Table 2, Sn, Sb, and Ti have similar radius sizes, and Si may have a similar radius size to that of Ni. Ni and Sn have a specific resistance equal to or less than about 10 μohmcm, and all elements except Si have a negative heat of mixing with Sb. FIG. 1 illustrates examples of heat of mixing of elements having a negative heat of mixing with Sb, at room temperature.

Various examples of the titanium-based amorphous alloy according to the embodiment are shown in Tables 3 through 9C.

Table 3 shows an example in which Sb is added to a ternary system of TiCuNi, wherein the entire TiCuNi is substituted with Sb at various ratios.

TABLE 3

| No. | Samples | | Compositions (at. %) | | | |
|---|---|---|---|---|---|---|
| | Compositions (at. %) | | Ti | Cu | Ni | Sb |
| T3-2 | $Ti_{50}Cu_{1.9}Ni_{9.5})_{95}Sb_5$ | $Ti_{47.5}Cu_{33.3}Ni_{14.2}Sb_5$ | 46.5 | 33.8 | 14.7 | 5.0 |
| T3-3 | $Ti_{50}Cu_{1.9}Ni_{9.5})_{90}Sb_{10}$ | $Ti_{45}Cu_{33.3}Ni_{13.5}Sb_{10}$ | 44.8 | 31.4 | 13.7 | 10 |
| T3-4 | $Ti_{50}Cu_{1.9}Ni_{9.5})_{85}Sb_{15}$ | $Ti_{42.5}Cu_{33.3}Ni_{12.75}Sb_{15}$ | 42.2 | 30.2 | 13.1 | 14.5 |
| T3-5 | $Ti_{50}Cu_{1.9}Ni_{9.5})_{80}Sb_{20}$ | $Ti_{40}Cu_{33.3}Ni_{12}Sb_{20}$ | 40.2 | 27.6 | 12.4 | 19.7 |

Figure 2:
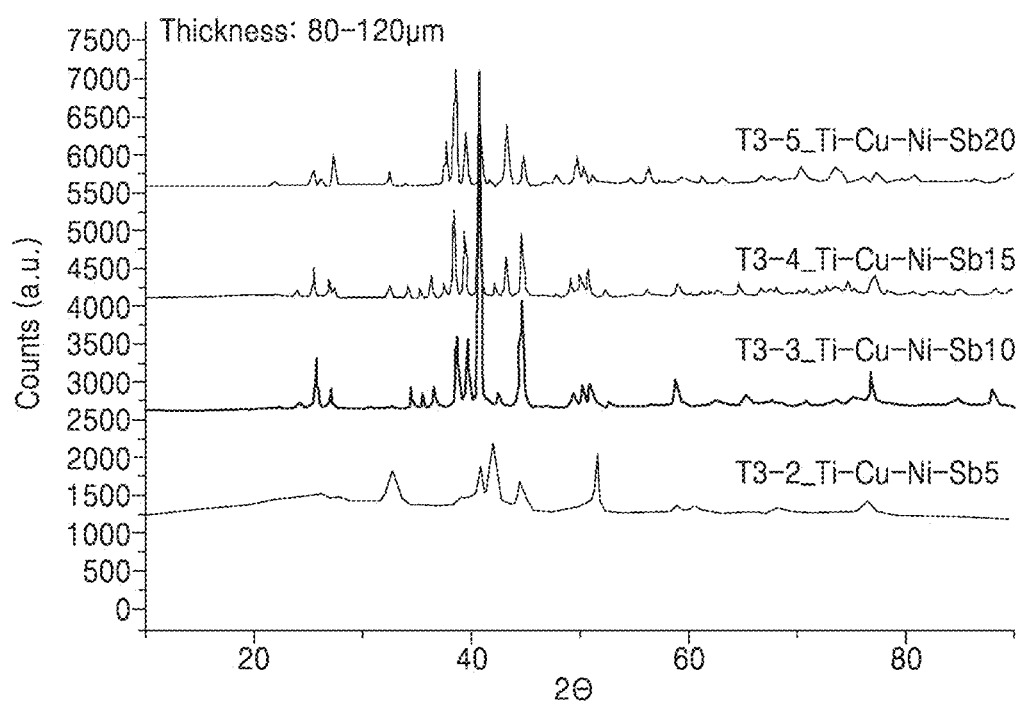
FIG. 2 shows an XRD pattern of samples T3-2, T3-3, T3-4, and T3-5 of Table 3.

In Table 3, an example is shown, in which a ternary system ratio of TiCuNi is reduced to 95, 90, 85, and 80 at. %, and a ratio of Sb is increased to 5, 10, 15, and 20 at. %. FIG. 2 shows XRD patterns of samples T3-2, T3-3, T3-4, and T3-5, wherein samples T3-2, T3-3, T3-4, and T3-5 include a crystalline phase, and also, for example, in sample T3-2, bump-shaped peaks are formed, which indicates that an amorphous phase is included.

As described above, a titanium-based amorphous alloy may be formed by adding Sb to a ternary system of TiCuNi at an appropriate ratio, and not only an amorphous phase but a crystalline phase may also be obtained, and thus, a reversible phase change between a titanium-based amorphous alloy phase and at least one crystalline phase is possible. Thus, the titanium-based amorphous alloy may be used as a phase-change material, for example, as a phase-change material for a memory device.

Table 4 shows an example in which Sb is added to a quaternary system of TiCuNiSn, wherein the entire TiCuNiSn is substituted with Sb at various ratios.

TABLE 4

| No. | Samples | | Compositions (at. %) | | | | |
|---|---|---|---|---|---|---|---|
| | Compositions (at. %) | | Ti | Cu | Ni | Sn | Sb |
| T4-2 | $Ti_{50}Cu_{30}Ni_{15}Sn_5)_{95}Sb_5$ | $Ti_{47.5}Cu_{28.5}Ni_{14.2}Sn_{4.75}Sb_5$ | 48.1 | 28.2 | 14.1 | 4.6 | 4.9 |
| T4-3 | $Ti_{50}Cu_{30}Ni_{15}Sn_5)_{90}Sb_{10}$ | $Ti_{45}Cu_{27}Ni_{13.5}Sn_{4.5}Sb_{10}$ | 45.4 | 26.9 | 13.3 | 4.4 | 9.9 |
| T4-4 | $Ti_{50}Cu_{30}Ni_{15}Sn_5)_{85}Sb_{15}$ | $Ti_{42.5}Cu_{25.5}Ni_{12.75}Sn_{4.25}Sb_{15}$ | 43.2 | 25.1 | 12.5 | 4.2 | 15 |
| T4-5 | $Ti_{50}Cu_{30}Ni_{15}Sn_5)_{95}Sb_{20}$ | $Ti_{40}Cu_{24}Ni_{12}Sn_{4.0}Sb_{20}$ | 38.1 | 25.9 | 13.3 | 4.0 | 18.7 |

In Table 4, an example is shown, in which a quaternary system ratio of TiCuNiSn is reduced to 95, 90, 85, and 80 at. %, and a ratio of Sb is increased to 5, 10, 15, and 20 at. %.

Table 5 shows an example in which Sb is added to a ternary system of TiNiSn, wherein the entire TiNiSn is substituted with Sb at various ratios.

TABLE 5

| Samples | | Compositions (at. %) | | | |
|---|---|---|---|---|---|
| No. | Compositions (at. %) | Ti | Cu | Ni | Sb |
| T5-2 | $(Ti_{57}Ni_{37}Sn_6)_{95}Sb_5$ | $Ti_{54.15}Ni_{35.15}Sn_{5.7}Sb_5$ | 54.3 | 35.3 | 5.5 | 4.8 |
| T5-3 | $(Ti_{57}Ni_{37}Sn_6)_{90}Sb_{10}$ | $Ti_{51.3}Ni_{33.3}Sn_{5.4}Sb_{10}$ | 51.4 | 33.5 | 5.3 | 9.8 |

In Table 5, an example is shown, in which a ternary system ratio of TiNiSn is reduced to 95 and 90 at. %, and a ratio of Sb is increased to 5 and 10 at. %.

Table 6 shows partial substitution of Sn of TiNiSnSb, with Sb.

TABLE 6

| Samples | | Compositions (at. %) | | | |
|---|---|---|---|---|---|
| No. | Compositions (at. %) | Ti | Ni | Sn | Sb |
| T5-4 | $Ti_{51}Ni_{33}Sn_4Sb_{12}$ | 51 | 33 | 4 | 12 |
| T5-5 | $Ti_{51}Ni_{33}Sn_2Sb_{14}$ | 51 | 33 | 2 | 14 |
| T5-6 | $Ti_{51}Ni_{33}Sb_{16}$ | 51 | 33 | 0 | 16 |

In Table 6, an example is shown, in which a ratio of Sn of TiNiSnSb is reduced to 4, 2, and 0 at. % and a ratio of Sb is increased to 12, 14, and 16 at. %.

Table 7 shows a variation in a specific resistance of a Ti—Ni—Sn ternary system when a Sb content in the Ti—Ni—Sn ternary system increases.

TABLE 7

| Sb content (at. %) | Compositions (at. %) | Thickness (μm) | Specific resistance (mΩcm) (with respect to crystalline phase) |
|---|---|---|---|
| 0 | $Ti_{57}Ni_{37}Sn_6$ | 86 | 0.180 |
| 5 | $(Ti_{57}Ni_{37}Sn_6)_{95}Sb_5$ | 100 | 0.258 |
| 10 | $(Ti_{57}Ni_{37}Sn_6)_{90}Sb_{10}$ | 50 | 0.316 |
| 12 | $Ti_{57}Ni_{33}Sn_4Sb_{12}$ | 60 | 0.386 |
| 14 | $Ti_{51}Ni_{33}Sn_2Sb_{14}$ | 71 | 0.410 |
| 16 | $Ti_{49}Ni_{33}Sn_2Sb_{16}$ | 60 | 3.23 |
| 18 | $Ti_{47}Ni_{33}Sn_2Sb_{18}$ | 25 | 3.71 |
| 18 | $Ti_{49}Ni_{29}Si_4Sb_{18}$ | 85 | 5.19 |

Figure 3:
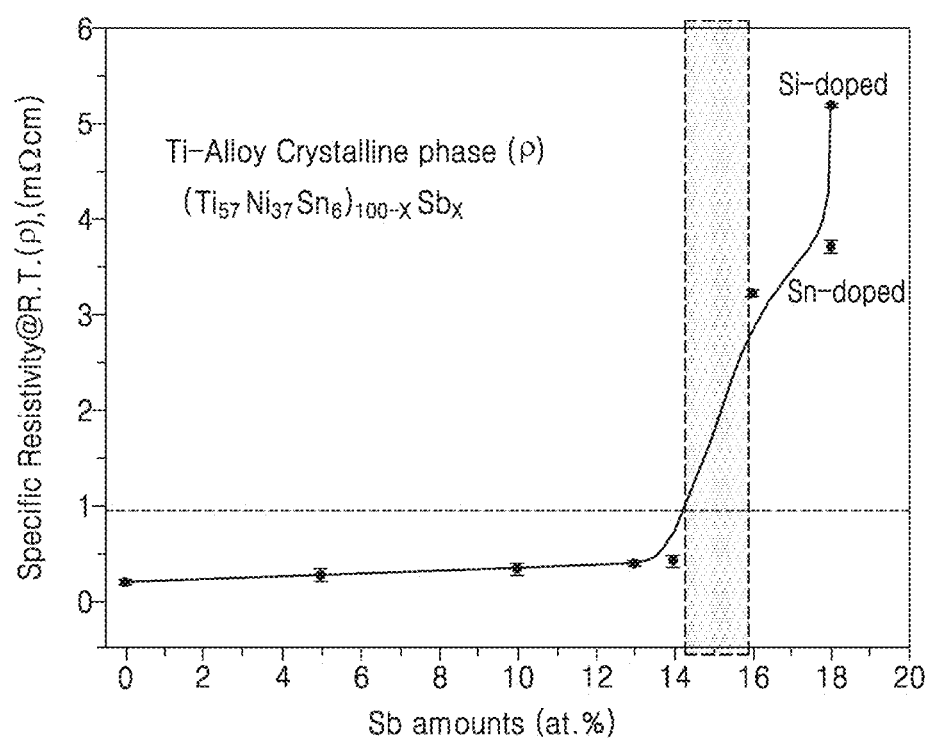
FIG. 3 is a graph showing a variation in specific resistance of a Ti—Ni—Sn ternary system when Sb content in the Ti—Ni—Sn ternary system increases.

Also, FIG. 3 is a graph showing a variation in a specific resistance of a Ti—Ni—Sn ternary system when a Sb content in the Ti—Ni—Sn ternary system increases.

Referring to FIG. 3 and Table 7, as an Sb content increases from 0 at. % to 18 at. %, a specific resistance of a titanium-based amorphous alloy increases from 0.18 mΩ cm to about 5.19 mΩ cm. When the Sb content is equal to or higher than 16 at. %, a specific resistance of the titanium-based amorphous alloy is about 1 mΩ cm or higher. Also, a specific resistance of the titanium-based amorphous alloy increases more in a composition to which Si is added.

In FIG. 3 and Table 7, the specific resistances of the samples were measured when the samples are all in a crystalline phase, and a comparative sample in which a Sb content is 0 at. % does not include a Sb component, and a specific resistance of the comparative example is a value measured in an amorphous phase.

Figure 4:
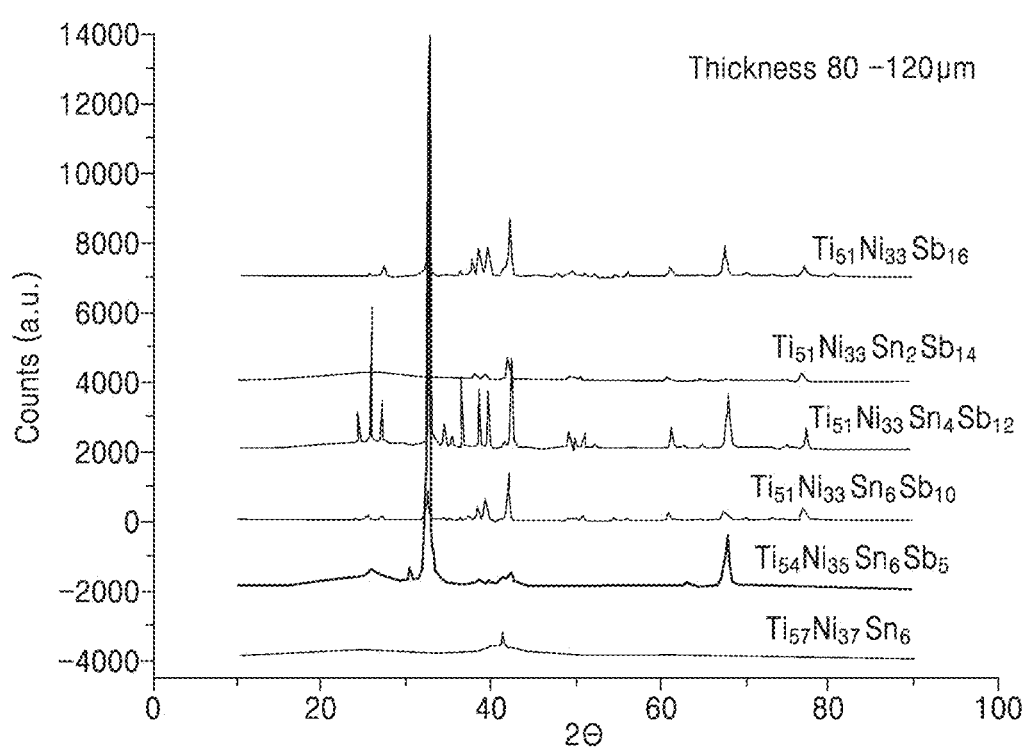
FIG. 4 shows XRD patterns of various samples of Table 6-7.

FIG. 4 shows XRD patterns of the various samples of Tables 6-7, and samples including a Sb component include a crystalline phase. Also, bump-shaped peaks are formed in the various samples, which indicates that an amorphous phase is included. Also, the comparative sample not including a Sb component includes only an amorphous phase. In FIG. 4, $Ti_{51}Ni_{33}Sn_6Sb_{10}$ corresponds to $(Ti_{57}Ni_{37}Sn_6)_{90}Sb_{10}$ and $Ti_{54}Ni_{35}Sn_6Sb_5$ corresponds to $(Ti_{57}Ni_{37}Sn_6)_{95}Sb_5$.

As described above, as apparent from FIG. 4, from the titanium-based amorphous alloy formed by adding Sb at an appropriate ratio, not only an amorphous phase but also a crystalline phase may be obtained, and since the titanium-based amorphous alloy has a specific resistance also in a crystalline phase, a reversible phase change between a titanium-based amorphous alloy phase and at least one crystalline phase is possible, and thus the titanium-based amorphous alloy may be used as a phase-change material, for example, as a phase-change material for a memory device.

Table 8 shows various examples of partial substitution of Ti with Sb and/or partial substitution of Ni with Si with respect to samples T5-5($Ti_{51}Ni_{33}Sn_2Sb_{14}$) and T5-6 ($Ti_{51}Ni_{33}Sb_{16}$).

TABLE 8

| Samples | | Compositions (at. %) | | | | | |
|---|---|---|---|---|---|---|---|
| No. | Compositions (at. %) | Ti | Ni | Sn | Sb | Si | |
| T5-5 | $Ti_{51}Ni_{33}Sn_2Sb_{14}$ | 51 | 33 | 2 | 14 | 0 | Ti→Sb |
| T5-5-1 | $Ti_{49}Ni_{33}Sn_2Sb_{16}$ | 49 | 33 | 2 | 16 | 0 | Ti→Sb |
| T5-5-2 | $Ti_{47}Ni_{33}Sn_2Sb_{18}$ | 47 | 33 | 2 | 18 | 0 | Ti→Sb |
| T5-6 | $Ti_{51}Ni_{33}Sb_{16}$ | 51 | 33 | 0 | 16 | 0 | Ti→Sb |
| T5-6-1 | $Ti_{49}Ni_{33}Sb_{18}$ | 49 | 33 | 0 | 18 | 0 | Ti→Sb |
| T5-6A | $Ti_{51}Ni_{31}Sb_{16}Si_2$ | 51 | 31 | 0 | 16 | 2 | Ni→Si |
| T5-6B | $Ti_{51}Ni_{29}Sb_{16}Si_4$ | 51 | 29 | 0 | 16 | 5 | Ni→Si |
| T5-6C | $Ti_{51}Ni_{27}Sb_{16}Si_6$ | 50 | 27 | 0 | 15 | 7 | Ni→Si |
| T5-6X | $Ti_{49}Ni_{29}Sb_{18}Si_4$ | 48 | 29 | 0 | 18 | 5 | Ti→Sb |

In Table 8, samples T5-5-1 and T5-5-2 correspond to partial substitution of Ti of sample T5-5 with Sb; sample T5-6-1 corresponds to partial substitution of Ti of sample T5-6 with Sb; samples T5-6A, T5-6B, and T5-6C correspond to partial substitution of Ni of sample T5-6 with Si; and sample T5-6X corresponds to partial substitution of Ti of sample T5-6B with Sb.

Figure 5:
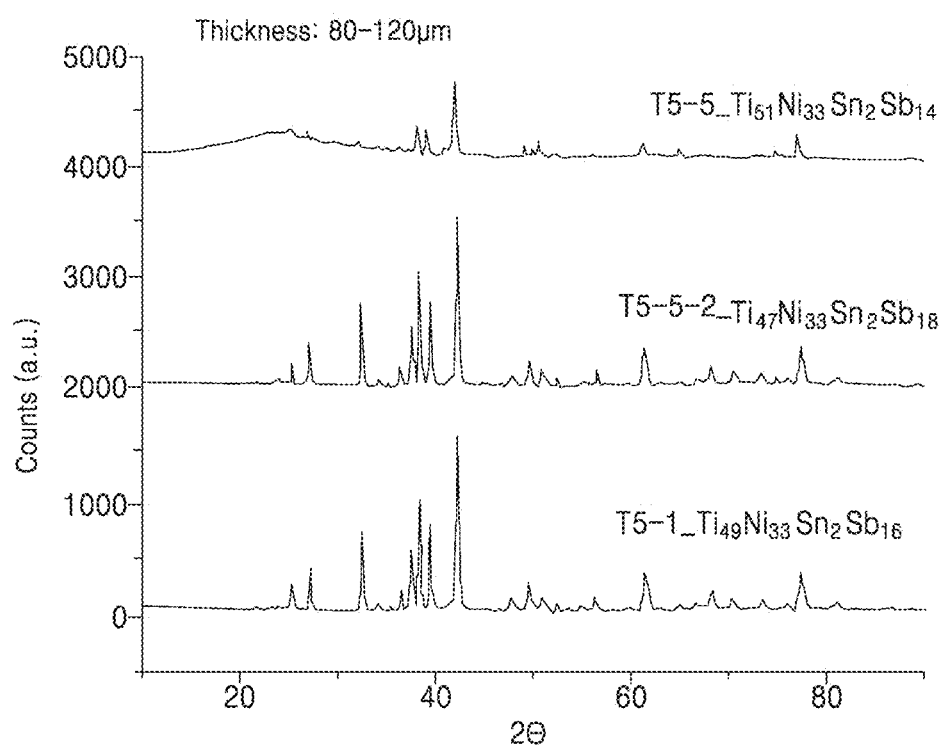
FIG. 5 shows XRD patterns of samples T5-5, T5-5-1, and T5-5-2 of Table 8.

FIG. 5 shows XRD patterns of samples T5-5, T5-5-1, and T5-5-2 of Table 8, and samples T5-5, T5-5-1, and T5-5-2 all include a crystalline phase, and bump-shaped peaks are generated, and which indicates that an amorphous phase is included.

Figure 6:
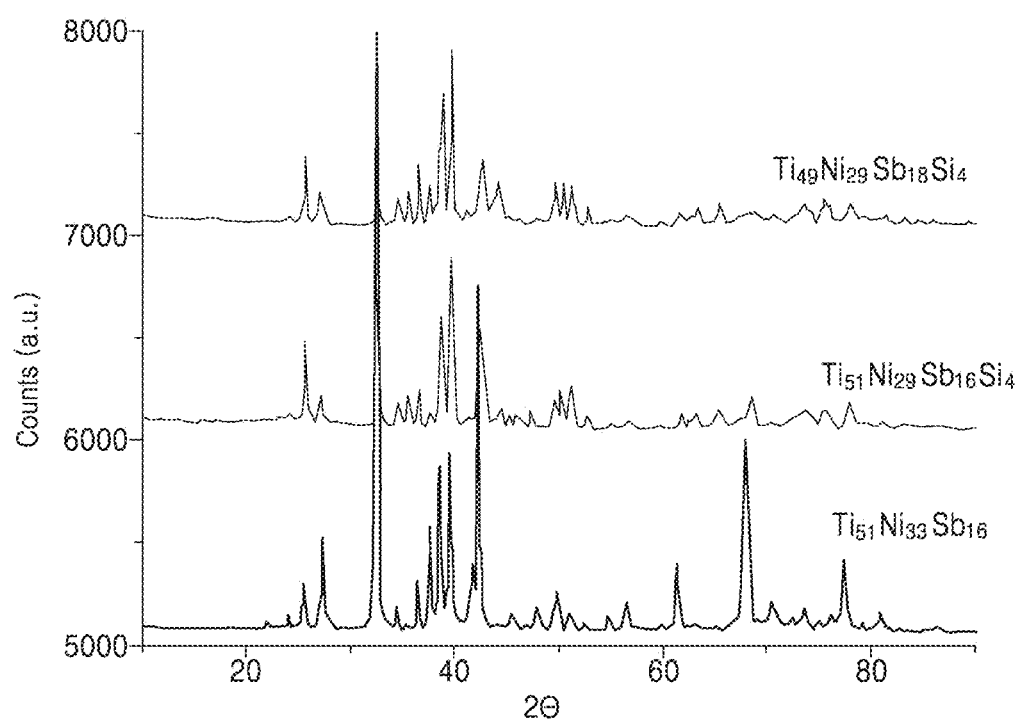
FIG. 6 shows XRD patterns of samples T5-6 ($Ti_{51}Ni_{33}Sb_{16}$), T5-6B ($Ti_{51}Ni_{29}Sb_{16}Si_4$), and T5-6X ($Ti_{49}Ni_{29}Sb_{18}Si_4$) of Table 8.

FIG. 6 shows XRD patterns of samples T5-6 (Ti51Ni33Sb16), T5-6B (Ti51Ni29Sb16Si4), and T5-6X (Ti49Ni29Sb18Si4), where samples T5-6 (Ti51Ni33Sb16), T5-6B (Ti51Ni29Sb16Si4), and T5-6X (Ti49Ni29Sb18Si4) all include a crystalline phase, and also, bump-shaped peaks are formed, which indicates that an amorphous phase is included.

Thus, as is evident from FIGS. 5 and 6, when a titanium-based amorphous alloy is based on titanium (Ti), and antimony (Sb) is added thereto, and the titanium-based amorphous alloy includes nickel (Ni), or at least one metallic component (for example, Sn) or a metalloid (for example, Si) is further included therein, the titanium-based amorphous alloy has a specific resistance in a crystalline phase.

Tables 9A to 9C shows a result of repeatedly measuring surface resistance and specific resistance of the samples of Table 8.

[Table 9]

TABLE 9A

| | | Dimensions | | |
|---|---|---|---|---|
| No. | Composition | W (mm) | t (μm) | L (mm) |
| T5-6B | $Ti_{51}Ni_{29}Sb_{16}Si_4$ | | 55 | |
| T5-6C | $Ti_{51}Ni_{27}Sb_{16}Si_6$ | | 80 | |
| T5-6X | $Ti_{49}Ni_{29}Sb_{18}Si_4$ | 5 | 85 | 25 |
| T5-5-1 | $Ti_{49}Ni_{33}Sn_2Sb_{16}$ | | 60 | |
| T5-5-2 | $Ti_{47}Ni_{33}Sn_2Sb_{18}$ | | 25 | |

TABLE 9B

| | | Surface resistance (mΩ/square) | | |
|---|---|---|---|---|
| No. | Composition | 1st | 2nd | 3rd |
| T5-6B | $Ti_{51}Ni_{29}Sb_{16}Si_4$ | 585.3 | 592.1 | 583.1 |
| T5-6C | $Ti_{51}Ni_{27}Sb_{16}Si_6$ | 612.62 | 601.2 | 619.4 |
| T5-6X | $Ti_{49}Ni_{29}Sb_{18}Si_4$ | 605.3 | 608.2 | 610.3 |
| T5-5-1 | $Ti_{49}Ni_{33}Sn_2Sb_{16}$ | 623.8 | 626.1 | 605.7 |
| T5-5-2 | $Ti_{47}Ni_{33}Sn_2Sb_{18}$ | 621.6 | 619.3 | 619.3 |

TABLE 9C

| | | Specific resistance (m Ω cm) | | | |
|---|---|---|---|---|---|
| No. | Composition | 1st | 2nd | 3rd | Average |
| T5-6B | $Ti_{51}Ni_{29}Sb_{16}Si_4$ | 3.22 | 3.26 | 3.21 | 3.23 |
| T5-6C | $Ti_{51}Ni_{27}Sb_{16}Si_6$ | 4.90 | 4.81 | 4.96 | 4.89 |
| T5-6X | $Ti_{49}Ni_{29}Sb_{18}Si_4$ | 5.15 | 5.17 | 5.19 | 5.17 |
| T5-5-1 | $Ti_{49}Ni_{33}Sn_2Sb_{16}$ | 3.74 | 3.76 | 3.63 | 3.71 |
| T5-5-2 | $Ti_{47}Ni_{33}Sn_2Sb_{18}$ | 1.55 | 1.55 | 1.55 | 1.55 |

As shown in Tables 9A to 9C, samples T5-5-1, T5-5-2, T5-6B, T5-6C, and T5-6X also have a specific resistance when they are repeatedly measured; and the samples have a specific resistance value of 1 mΩ cm or more, and reach a maximum value of about 5.17 mΩ cm. Thus, the samples are applicable as a semiconductor phase-change material. That is, as reproducibility may be provided, the titanium-based amorphous alloy according to the embodiment is applicable as a phase-change material of a phase-change memory device.

According to example embodiments, a titanium-based amorphous alloy includes titanium (Ti), antimony (Sb), nickel (Ni), optionally at least one other element (D'). The titanium-based amorphous alloy being represented by Chemical Formula 1:

$$Ti_aSb_bNi_cD'_d,$$ [Chemical Formula 1]

In Chemical Formula 1: a+b+c+d may equal 1; a may be greater than 0.2; b may be greater than 0 and less than 0.3; c may be greater than 0.05 and less than 0.40; and d may be greater than or equal to 0. The titanium-based amorphous alloy may be capable of having a reversible phrase change, between a titanium-based amorphous alloy phase and at least one crystalline phase, in response to an applied energy to the titanium-based amorphous alloy.

In some embodiments, a titanium-based amorphous alloy may further include a dopant selected from B, Si, Ge, As, Te, C, N, P, S, Se, Ce, Dy, Er, Eu, Gd, Ho, La, Lu, Pr, Pm, Sm, Sc, Tb, Tm, Yb, and Y. The titanium-based amorphous alloy may be Te-free.

In some embodiments, a titanium-based alloy may include copper (Cu), both Cu and tin (Sn), or both Cu and silicon (Si). The titanium-based alloy optionally may include at least one other element (E'). The titanium-based amorphous alloy may be represented by Chemical Formula 1A:

$$Ti_aSb_bNi_cCu_dSn_eSi_fE'_g,$$ [Chemical Formula 1A]

In Chemical Formula 1A: a+b+c+d+e+f+g may equal 1; a may be in a range from 0.30 to 0.60; b may be greater than 0 and less than 0.30; c may be greater than 0.07 and less than 0.40; d may be greater than 0.20 and less than 0.40; and e, f, and g may each independently be greater than or equal to 0.

In some embodiments, in Chemical Formula 1A: a may be in a range from 0.35 to 0.57; b may greater than 0 and less than 0.23; c may be greater than 0.09 and less than 0.38; d may be in a range from 0.22 to 0.37; a+b+c+d may be greater than or equal to 0.9; e may be 0 if f is greater than 0; f may be 0 if e is greater than 0; g may be 0; and the titanium-based amorphous alloy may be Te-free.

According to an aspect of another embodiment, a phase-change memory device is provided. The phase-change memory device may include a first electrode; a second electrode spaced apart from the first electrode; and a phase-change layer between the first electrode and the second electrodes. The phase-change layer may include the titanium-based amorphous alloy described above.

The numerical values of Tables 1 through 9C, Chemical Formula 1, Chemical Formulas 1A, and FIGS. 1 through 6 above are non-limiting examples, and the embodiments are not limited thereto and may be modified according to conditions of samples.

As described above, a titanium-based amorphous alloy which is based on titanium and to which antimony is added, and which further includes at least one metallic component, allows a reversible phase change between an amorphous alloy phase and at least one crystalline phase, and thus may be used as a phase-change material.

Figure 7:
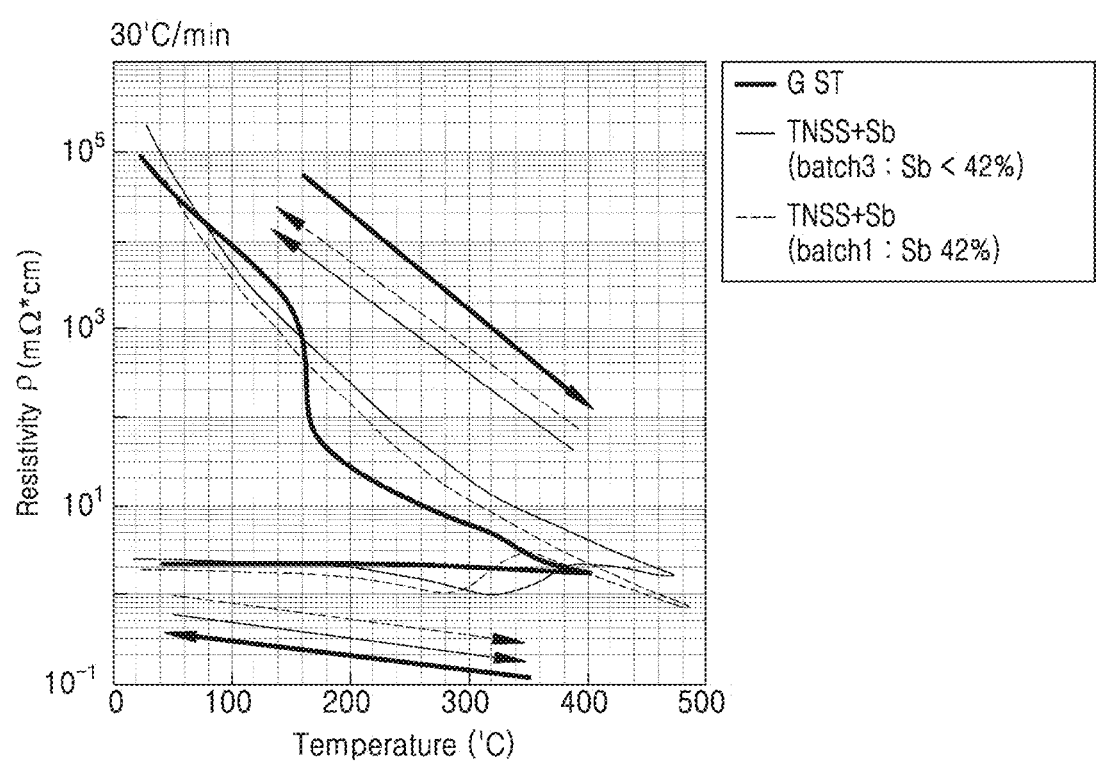
FIG. 7 shows a variation in resistance of a titanium-based amorphous alloy according to temperature compared with that of GST (chalcogenide)

FIG. 7 shows a variation in a resistance of a titanium-based amorphous alloy according to temperature compared with that of a GST (chalcogenide). GST is a well-known phase-change material.

Referring to FIG. 7, the titanium-based amorphous alloy according to the embodiment exhibits a characteristic similar to that of GST with respect to the resistance change characteristic with temperature. A sample used in measuring resistance variation characteristics according to temperature is a titanium-based amorphous alloy of TiNiSnSb; a titanium-based amorphous alloy of TiNiSnSb on which batch processing is conducted such that 42% of Sb is included and a titanium-based amorphous alloy of TiNiSnSb on which batch processing is conducted such that less than 42% of Sb is included, wherein similar resistance variation characteristics according to temperature to that of GST are shown in both cases. That is, it is evident from FIG. 7 that the titanium-based amorphous alloy according to the embodiment is applicable as a phase-change material.

Figure 8:
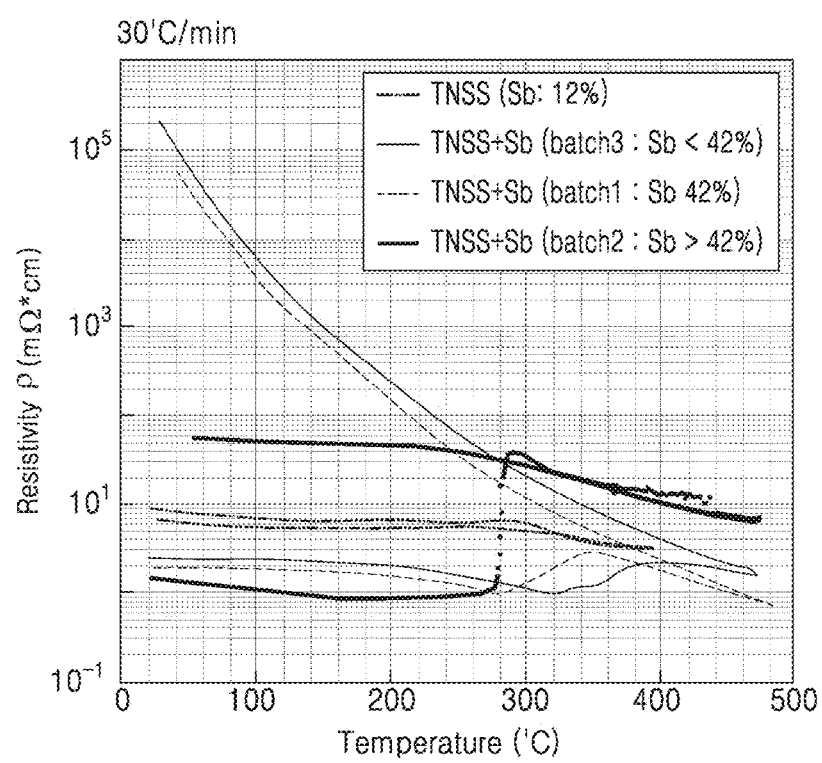
FIG. 8 shows a variation in resistance of a titanium-based amorphous alloy according to embodiments, according to temperature.

FIG. 8 shows a variation in a resistance of a titanium-based amorphous alloy according to embodiments, according to temperature.

The variation in resistance of the titanium-based amorphous alloy according to temperature shown in FIG. 8 relates to a sample including pure TNSS (TiNiSnSb, Sb: 12%) and samples in which Sb is contained at less than 42% (batch3), at 42% (batch1), and at more than 42% (batch3) in TNSS and on which batch processing is conducted, respectively, and it is shown that resistance variation characteristics according to temperature vary based on Sb content. Accordingly, it is evident from FIG. 8 that as a Sb content in TNSS is adjusted, resistance variation characteristics according to temperature, which correspond to a phase-change material, may be obtained.

Figure 9:
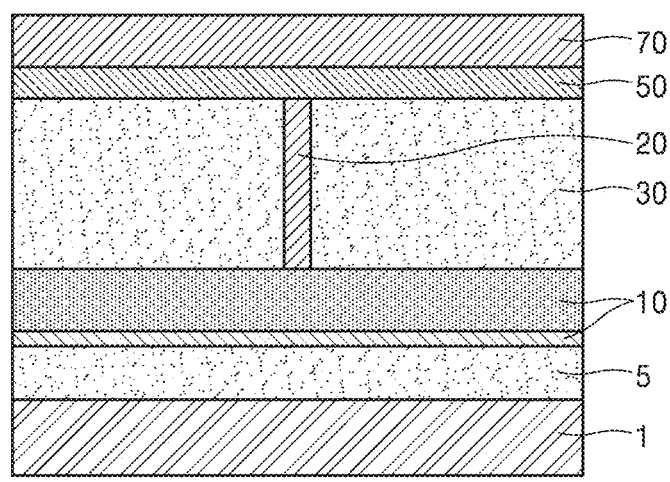
FIG. 9 schematically illustrates a phase-change memory device in which a titanium-based amorphous alloy according to an embodiment is applied to a phase change material.

FIG. 9 schematically illustrates a phase-change memory device in which a titanium-based amorphous alloy according to an embodiment is applied to a phase change material. The phase-change memory device illustrated in FIG. 9 is an example, and a phase-change memory device in which a titanium-based amorphous alloy according to an embodiment is applied to a phase change layer may have various configurations.

Referring to FIG. 9, the phase-change memory device according to the embodiment may include first and second electrodes 20 and 70 spaced apart from each other and a phase change layer 50 positioned therebetween.

The first electrode 20 may be a bottom electrode. For example, the first electrode 20 may be a plug-type electrode. In this case, the first electrode 20 may be included, for example, within a contact hole of an interlayer insulating layer 30. A pad-type electrode 10 contacting the first electrode 20 may be further included on a lower surface of the interlayer insulating layer 30. The second electrode 70 may be a top electrode. The first electrode 20 included as a plug-type electrode may have a smaller width than the phase change layer 50. The first electrode 20 may be a bottom electrode and may be, for example, a heating electrode or a resistive electrode. The first electrode 20 and the second electrode 70 may include an electrode material used in the field of memory devices that include a phase change layer, such as a typical phase-change random access memory (RAM) or a resistance-change RAM.

The first electrode 20 may include, for example, at least one conductive material from among various conductive materials such as titanium nitride (TiN), tantalum nitride (TaN), TiAlN, TaSiN, tungsten nitride (WN), tungsten nitride carbide (WNC), and doped Si.

The second electrode 70 may include at least one of various conductive materials such as Al, Au, Cu, Ir, Ru, Pt, Ti, TiN, Ta, and TaN.

Also, the pad-type electrode 10 contacting the first electrode 20 may include at least one of various conductive materials such as Al, Au, Cu, Ir, Ru, Pt, Ti, TiN, Ta, and TaN, and may have a single-layer or multi-layer structure. For example, the pad-type electrode 10 may have a double-layer structure of Al/Ti. The pad-type electrode 10 may be formed of a conductive material that is identical to or different from that of the second electrode 70. In FIG. 9, an example in which the phase-change memory device includes the pad-type electrode 10 is illustrated, but the pad-type electrode 10 may also be omitted.

The phase change layer 50 may be provided such that information is stored based on a difference in resistance via a phase change via an electrical signal applied through the first and second electrodes 20 and 70.

As the phase change layer 50, a titanium-based amorphous alloy described above of various embodiments which is based on titanium (Ti) and to which antimony (Sb) is added, and which further includes at least one metallic component may be applied. The phase change layer 50 as described above allows a reversible phase change between a titanium-based amorphous alloy phase and at least one crystalline phase. Here, the crystalline phase may be varied according to an applied electrical signal. For example, according to an applied electrical signal, an amorphous phase may be changed to a first crystalline phase or to a second crystalline phase that is different from the first crystalline phase.

The titanium-based amorphous alloy applied as a phase-change material to the phase change layer 50 may have a Ti content of 20% or more and may be formed tellurium (Te)-free. The titanium-based amorphous alloy applied as a phase-change material to the phase change layer 50 may include, for example, nickel (Ni) as a metallic component. That is, the titanium-based amorphous alloy may include, for example, $Ti_xNi_ySb_z$ (where x, y, and z>0). Here, the titanium-based amorphous alloy applied as a phase-change material to the phase change layer 50 may include, instead of Ni, at least one of Cu, Zr, Sn, Be, and Pd as a metallic component in addition to titanium and antimony.

Also, the titanium-based amorphous alloy applied as a phase-change material to the phase change layer 50 may further include at least one additional component in addition to titanium, antimony, and at least one metallic component, and the additional component may include a metallic component or a metalloid component. For example, the titanium-based amorphous alloy applied as a phase-change material to the phase change layer 50 may further include at least one of Cu, Zr, Sn, Be, Pd, and Si, as the additional component. Cu, Zr, Sn, Be, and Pd may correspond to a metallic component, and Si may correspond to a metalloid component.

Also, the titanium-based amorphous alloy applied as a phase-change material to the phase change layer 50 may be doped with a dopant. A dopant used in doping the titanium-based amorphous alloy applied as a phase-change material to the phase change layer 50 may include at least one of a metalloid, a non-metal, and a rare earth element. For example, the dopant may include a metalloid which is at least one of B, Si, Ge, As, and Te. The dopant may include a non-metal of at least any one of C, N, P, S, and Se. Also, the dopant may include at least one rare earth element from among cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y).

A stacked structure of the phase-change memory device according to the embodiment may be formed on a substrate 1 having an insulating layer 5 on a surface thereof. The insulating layer 5 may be formed of, for example, $SiO_2$, and other various insulating materials may also be used. As the substrate 1, for example, a silicon substrate (Si) may be used, and other various types of substrates may also be used. For example, the phase-change memory device according to the embodiment may be stacked on a silicon-on-insulator (SOI) substrate.

According to the phase-change memory device as described above, a phase of the phase change layer 50 may be changed according to an electrical signal applied to the phase change layer 50 through the first electrode 20 and the second electrode 70. The phase change layer 50 may have an amorphous state, and a phase of at least a portion of the phase change layer 50 may be changed to a crystalline phase according to an applied electrical signal.

By applying an electrical signal (electrical energy) to the phase change layer 50 through the first electrode 20 and the second electrode 70, a phase of the phase-change material in at least a region of the phase change layer 50 may be changed, for example, from an amorphous phase to a crystalline phase. The other region of the phase change layer 50 than the phase-change region may be an amorphous phase. An operation of forming a phase-change region in the phase change layer 50 may be referred to as a setting operation. According to a setting operation, a resistance (electrical resistance) of the phase change layer 50 may be lowered.

While a phase-change region in a crystalline phase is formed, when an electrical signal different from one during a setting operation is applied to the phase change layer 50, a phase of the phase-change region may be changed again. That is, a phase of the phase-change region may be changed from a crystalline phase to an amorphous phase. As a result, the phase change layer 50 may have an amorphous phase overall. An operation of changing a phase of a phase-change region to an amorphous phase again may be referred to as a resetting operation. According to this resetting operation, a resistance (electrical resistance) of the phase change layer 50 may be increased.

Here, instead of having an amorphous phase overall, the phase change layer 50 may have a crystalline phase overall, and the phase change layer 50 may also be implemented such that a phase of the phase-change region is changed to an amorphous phase according to an electrical signal applied to the phase change layer 50.

Meanwhile, in FIG. 9 and FIG. 10 which will be described later, the first electrode 20 is formed using a plug-type electrode, and a portion of the phase change layer 50 adjacent to the first electrode 20 corresponds to a phase-change region, but the embodiments are not limited thereto. For example, instead of forming the first electrode 20 as a plug-type electrode, a portion of the phase change layer 50 is formed in a plug-type, and a phase change layer 50 may be set such that the phase change occurs only in the portion of the phase change layer 50 corresponding to that plug, according to an electrical signal applied between the first and second electrodes 20 and 70.

Figure 10:
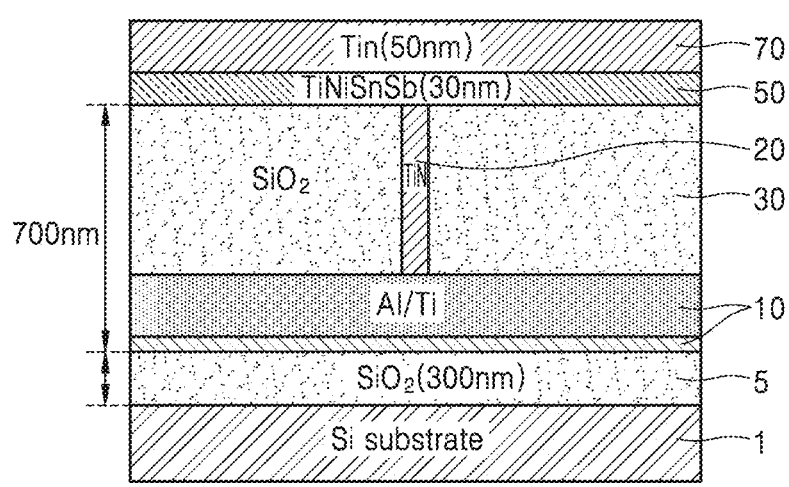
FIG. 10 illustrates a design example of the phase-change memory device of FIG. 9.

FIG. 10 illustrates a design example of the phase-change memory device of FIG. 9.

Referring to FIG. 10, an Si substrate is applied as the substrate 1, and SiO$_2$ having a thickness of about 300 nm is applied as the insulating layer 5, and the pad-type electrode 10 having a multi-layer structure of Al/Ti is formed on the insulating layer 5, and the first electrode 20 may be included within a contact hole of the interlayer insulating layer 30 formed of SiO$_2$ and as a TiN plug-type electrode. The pad-type electrode 10 and the first electrode 20, which is formed of a TiN plug-type electrode, may have a thickness of about 700 nm. The phase change layer 50 may be formed on the first electrode 20 and the interlayer insulating layer 30, by using a TiNiSnSb material to have a thickness of about 30 nm, and the second electrode 70 formed of TiN and having a thickness of about 50 nm may be formed on the phase change layer 50.

Figure 11:
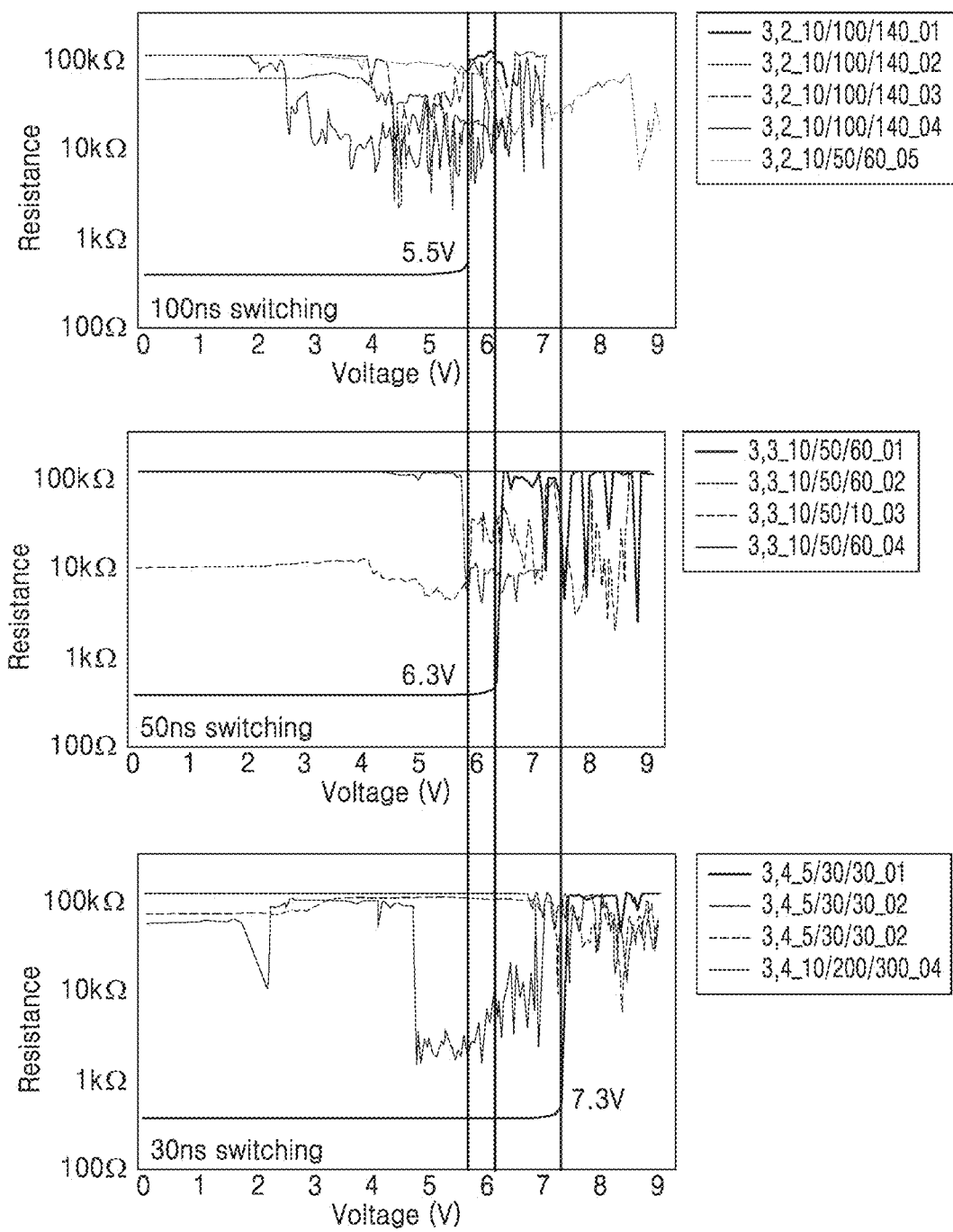
FIG. 11 shows graphs of variations in resistance in the phase-change memory device of the design example of FIG. 10 according to an applied voltage during switching performed by applying pulses having widths of 30 ns, 50 ns, and 100 ns, respectively.

FIG. 11 shows graphs of variation in resistance in the phase-change memory device of the design example of FIG. 10 according to an applied voltage during switching performed by applying pulses having widths of 30 ns, 50 ns, and 100 ns, respectively.

A variation in resistance from about 450Ω to about 100 kΩ was identified. After an increase in resistance to about 100 kΩ, the resistance was reduced to several kΩ again, and energy consumed in the variation in resistance was about 4.5 nJ.

TABLE 10

| | RESET process | | | SET process |
|---|---|---|---|---|
| Pulse width | 30 ns | 50 ns | 100 ns | 200 ns |
| Operation voltage | 7.3 V | 6.3 V | 5.5 V | 4.75 V |
| Operation energy | 3.52 nJ | 4.39 nJ | 6.58 nJ | 4.18 nJ |

Table 10 shows examples of operating voltages and operation energies of a reset process performed by applying pulses having widths of 30 ns, 50 ns, and 100 ns and a setting operation performed by applying a pulse having a width of 200 ns, with respect to the phase-change memory device of FIG. 10.

Figure 12:
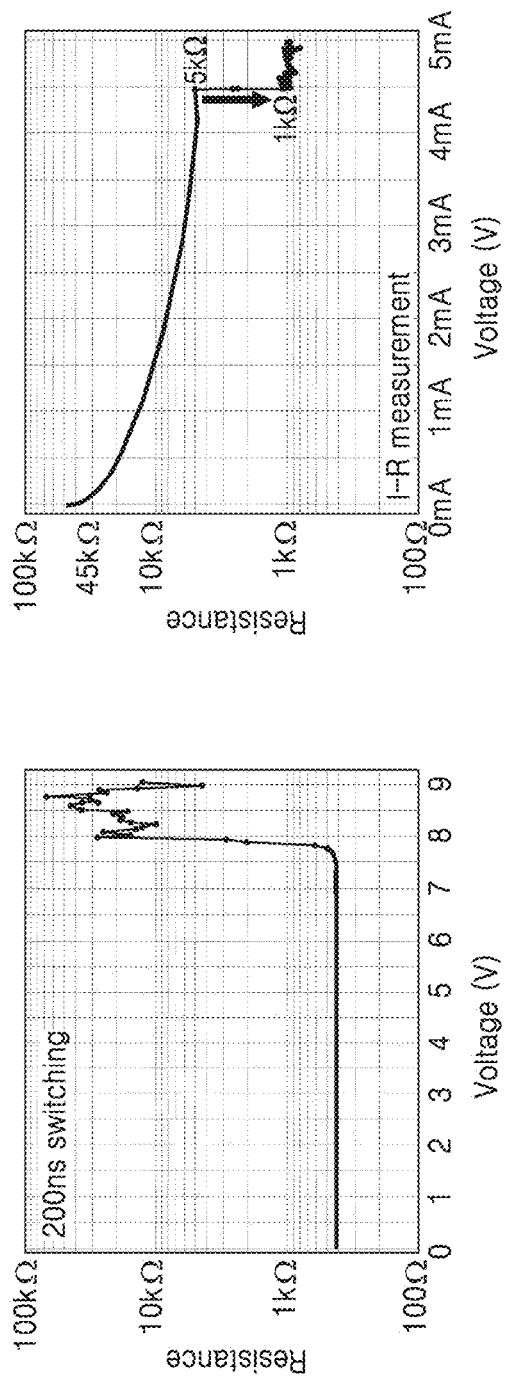
FIG. 12 illustrates a variation in resistance according to current after a phase-change region changes into an amorphous state via switching in a cell of the phase-change memory device of the design example of FIG. 10.

FIG. 12 illustrates a variation in resistance according to current after changing into an amorphous state via switching in a cell of the phase-change memory device of the design example of FIG. 10. Referring to FIG. 12, when a resistance is varied from 400Ω to 40 kΩ by applying a pulse having a width of 200 ns and then measuring an I-R up to 5 mA at an interval of about 1 μA, the resistance is gradually reduced up to a point of a current of 4.45 mA, and the resistance is reduced from about 5 kΩ to about 1 kΩ at the point of about 4.45 mA, which indicates a phase change.

Figure 13:
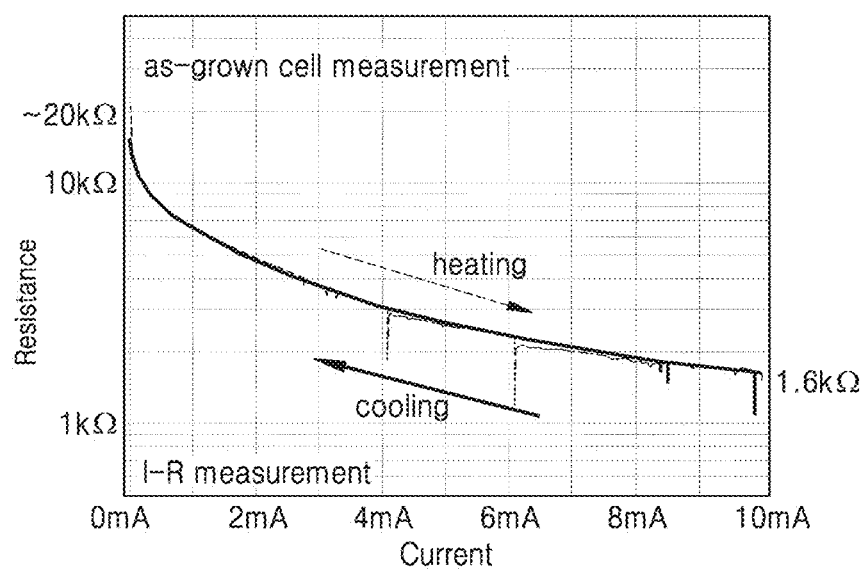
FIG. 13 illustrates resistance paths of a heating process and a cooling process in a cell of the phase-change memory device of the design example of FIG. 10.

FIG. 13 illustrates resistance paths of a heating process and a cooling process in a cell of the phase-change memory device of the design example of FIG. 10. During a heating process, a resistance is gradually reduced from 20 kΩ according to an increasing current, and reaches about 1.6 kΩ at 10 mA. A variation in resistance during a cooling process follows the same or similar resistance path of the heating process. As shown in FIG. 13, considering that a cooling process follows a same resistance path as that of a heating process, when manufacturing a phase-change memory device by applying a titanium-based amorphous alloy according to the embodiment to the phase change layer 50, reproducibility may be ensured.

The data of Tables 1 through 10 and FIGS. 1 through 13 above are non-limiting examples, and the embodiments are not limited thereto and may be modified according to conditions of samples.

The titanium-based amorphous alloy according to the embodiment is based on titanium, and antimony is added thereto, and the titanium-based amorphous alloy further includes at least one metallic component; as a reversible phase change between a titanium-based amorphous alloy state and at least one crystalline phase is possible, the titanium-based amorphous alloy may be used as a phase-change material.

Thus, when implementing a phase-change memory device by applying the titanium-based amorphous alloy according to the embodiment as a phase change material, information may be stored based on a difference between an amorphous phase and a crystalline phase, between which a reversible phase change is possible, and a high crystallization rate of the titanium-based amorphous alloy is obtained via a metallic bond, thus achieving fast phase transition.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A titanium-based amorphous alloy comprising:
   titanium;
   antimony;
   at least one metallic component, wherein the at least one metallic component includes Ni; and
   at least one additional metallic component or at least one metalloid component,
      wherein the titanium-based amorphous alloy is Te-free, and
      the titanium-based amorphous alloy being configured as a phase-change material capable of having a reversible phase change between a titanium-based amorphous alloy phase and at least one crystalline phase.

2. The titanium-based amorphous alloy of claim 1, further comprising:
   Cu, Zr, Sn, Be, Pd, Si, or a combination thereof.

3. The titanium-based amorphous alloy of claim 1, further comprising:
   a dopant,
   wherein the dopant includes at least one of a metalloid, a non-metal, or a rare-earth element.

4. The titanium-based amorphous alloy of claim 3, wherein the dopant is selected from B, Si, Ge, As, C, N, P, S, Se, Ce, Dy, Er, Eu, Gd, Ho, La, Lu, Nd, Pr, Pm, Sm, Sc, Tb, Tm, Yb, and Y.

5. The titanium-based amorphous alloy of claim 1, wherein a Ti content of the titanium-based amorphous alloy is 20% or higher.

6. A phase-change memory device comprising:
   a first electrode;
   a second electrode spaced apart from the first electrode; and
   a phase-change layer between the first electrode and the second electrode,
   wherein the phase-change layer includes the titanium-based amorphous alloy of claim 1.

7. The phase-change memory device of claim 6, further comprising:
   Cu, Zr, Sn, Be, Pd, Si, or a combination thereof.

8. The phase-change memory device of claim 6, further comprising:
   a dopant, wherein the dopant includes at least one of a metalloid, a non-metal, or a rare-earth element.

9. The phase-change memory device of claim 8, wherein the dopant comprises:
   at least one metalloid selected from B, Si, Ge, and As;
   at least one non-metal selected from C, N, P, S, and Se; or
   at least one rare-earth element selected from Ce, Dy, Er, Eu, Gd, Ho, La, Lu, Nd, Pr, Pm, Sm, Sc, Tb, Tm, Yb, and Y.

10. The phase-change memory device of claim 6, wherein a Ti content of the titanium-based amorphous alloy included in the phase-change layer is 20% or higher.

11. The phase-change memory device of claim 6, wherein the first electrode includes a plug-type electrode, and
   the plug-type electrode has a smaller width than the phase-change layer.

12. A titanium-based amorphous alloy comprising:
   titanium (Ti);
   antimony (Sb);
   nickel (Ni); and
   optionally at least one other element (D'), the titanium-based amorphous alloy being represented by Chemical Formula 1, $$Ti_aSb_bNi_cD'_d,$$ [Chemical Formula 1]

wherein, in Chemical Formula 1,
a+b+c+d=1,
a is greater than 0.2,
b is greater than 0 and less than 0.3,
c is greater than 0.05 and less 0.40,
d is greater than or equal to 0,
wherein the titanium-based amorphous alloy is Te-free, and
the titanium-based amorphous alloy is capable of having a reversible phrase change, between a titanium-based amorphous alloy phase and at least one crystalline phase, in response to an applied energy to the titanium-based amorphous alloy.

13. The titanium-based amorphous alloy of claim 12, wherein
   the titanium-based amorphous alloy includes copper (Cu), both Cu and tin (Sn), or both Cu and silicon (Si),
   the titanium-based amorphous alloy optionally includes at least one other element (E'),
   the titanium-based amorphous alloy is represented by Chemical Formula 1A, $$Ti_aSb_bNi_cCu_dSn_eSi_fE'_g,$$ [Chemical Formula 1A]

wherein, in Chemical Formula 1A,
a+b+c+d+e+f+g=1,
a is in a range from 0.30 to 0.60,
b is greater than 0 and less than 0.30,
c is greater than 0.07 and less than 0.40,
d is greater than 0.20 and less than 0.40, and
e, f, and g are each independently greater than or equal to 0.

14. The titanium-based amorphous alloy of claim 13, wherein, in Chemical Formula 1A,
a is in a range from 0.35 to 0.57,
b is greater than 0 and less than 0.23,
c is greater than 0.09 and less than 0.38,
d is in a range from 0.22 to 0.37,
a+b+c+d is greater than or equal to 0.9,
e is 0 if f is greater than 0,
f is 0 if e is greater than 0, and
g is 0.

* * * * *